(12) United States Patent
Mrozek et al.

(10) Patent No.: US 7,193,486 B2
(45) Date of Patent: Mar. 20, 2007

(54) TUNABLE, MAXIMUM POWER OUTPUT, FREQUENCY HARMONIC COMB GENERATOR

(75) Inventors: Eric M. Mrozek, Gardena, CA (US); Flavia S. Fong, Monterey Park, CA (US); Mark Kintis, Manhattan Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 118 days.

(21) Appl. No.: 11/038,354

(22) Filed: Jan. 19, 2005

(65) Prior Publication Data

US 2006/0158277 A1    Jul. 20, 2006

(51) Int. Cl.
  H03K 3/36    (2006.01)
  H03K 3/00    (2006.01)
(52) U.S. Cl. .................. 333/20; 307/106; 327/181
(58) Field of Classification Search .......... 333/20; 307/106; 327/164, 181, 184
  See application file for complete search history.

(56) References Cited

U.S. PATENT DOCUMENTS

| | | | | |
|---|---|---|---|---|
| 5,023,574 A | * | 6/1991 | Anklam et al. | 333/20 |
| 5,256,996 A | * | 10/1993 | Marsland et al. | 333/20 |
| 6,320,480 B1 | * | 11/2001 | Kintis et al. | 333/156 |
| 6,396,338 B1 | * | 5/2002 | Huang et al. | 329/336 |
| 6,480,728 B1 | * | 11/2002 | Mansour | 505/210 |
| 6,538,525 B1 | * | 3/2003 | Williamson | 333/20 |
| 6,690,247 B2 | * | 2/2004 | Kintis et al. | 333/20 |
| 7,094,204 B2 | | 8/2006 | Banjanin et al. | |
| 2001/0011930 A1 | | 8/2001 | Kintis et al. | |

FOREIGN PATENT DOCUMENTS

JP    63-124604 A    5/1988

* cited by examiner

*Primary Examiner*—Dean Takaoka
(74) *Attorney, Agent, or Firm*—John A. Miller; Warn, Hoffmann, Miller & Ozga, P.C.

(57) ABSTRACT

A comb frequency generator that is tunable to vary the width of the pulses in the output signal and achieve a maximum power output at different harmonic frequencies. A wavefront compression device receives a sinusoidal input signal and provides wavefront compression to create a compressed signal having a series of periodic fast edges. A delay device receives the fast-edge compressed signal and delays the fast-edge signal to create a delayed fast-edge signal. A combining device receives the original fast-edge compressed signal and the delayed fast-edge compressed signal to generate an output signal including a series of pulses having a width determined by the delay of the delayed signal. In one embodiment, the delay device is a shorted transmission line stub having a length selectively set by a series of MEM devices. In another embodiment, the delay device is an NLTL variable time delay device that delays the fast-edge signal.

20 Claims, 2 Drawing Sheets

TUNABLE, MAXIMUM POWER OUTPUT, FREQUENCY HARMONIC COMB GENERATOR

BACKGROUND OF THE INVENTION

1. Field of the Invention

This invention relates generally to a frequency harmonic comb generator and, more particularly, to a frequency harmonic comb generator that is tunable to vary the pulse width of the pulses in the output signal to provide maximum power for different harmonics.

2. Discussion of the Related Art

Comb frequency generators are well known devices that generate harmonics of a sinusoidal input signal. A comb frequency generator has many applications, including being used in frequency multipliers, local oscillators, and frequency synthesizers. The output signal of the comb generator is typically a series of narrow pulses, or impulses, that are periodic with the frequency of the input signal, where the output signal looks similar to the teeth of a comb and has a higher frequency than the input signal. The shape of the pulses defines the relative amplitudes and phases of the various harmonics in the output signal. Bandpass filters are used to filter out the undesirable harmonic pulses to select the desirable harmonics for a particular use. The selected harmonics can then be used, for example, as a modulation or demodulation carrier frequency. Multiple harmonics can be selectively filtered to provide a multi-channel device.

Comb generators typically convert the sinusoidal input signal to a signal having fast edges, i.e., pulses having very short rise or fall times. It is these fast edges or transitions that create the harmonics of the input signal. Various comb generators known in the art use comparators and limiting amplifiers to generate the fast edges. For those applications that require higher harmonics, state of the art comb generators typically employ step recovery diodes. The pulse width of the output signal is defined by the diode parameters of the step recovery diodes in the circuit configuration. The step recovery diodes hold an applied charge up to a certain voltage level, and then quickly release the charge to generate the fast edges. A discussion of using step recovery diodes for this purpose can be found in the document Harmonic Generation using step recovery diode and SRD module, Hewlett Packard.

Known comb generators have also employed non-linear transmission line (NLTL) wavefront compression devices to generate a signal having fast edges. The NLTL is typically a transmission line periodically loaded with varactor-type diodes that define an LC circuit. A discussion of NLTL wavefront compression used for this purpose can be found in the article, Case, Michael et al. "Picosecond duration, large amplitude impulse generation using electrical soliton effects," Appl. Phys. Lett. 60 (24), 15 Jun. 1992, pgs. 3019–3021. A Schottky-contact microstrip line (SCML) is disclosed in the article Jäger, Dieter, "Slow-Wave Propagation Along Variable Schottky-Contact Microstrip Line," IEEE Transactions On Microwave Theory And Techniques, Vol. MTT-24, No. 9, September 1976, pgs. 566–573. The SCML also generates a signal having fast edges that can be used in a comb generator. The SCML is a microstrip line formed on a semiconducting substrate including periodic Schottky-barrier diodes.

A disadvantage exists with the known comb generators because the width of the pulses in the output signal is fixed and is not variable. The output power of the generator for any selected harmonic can be maximized by carefully defining the pulse width of the harmonics. Only a subset of the harmonic frequencies is maximized for any given pulse width. In other words, only one of the harmonics in the output signal will have maximum power for a particular pulse width out of all of the pulses in the output signal. This disadvantage is a significant problem for those applications where different harmonics may be selected at different times during operation of the generator or for multi-channel devices.

Square pulses of amplitude A and width $\beta$ will have a spectral envelope defined by $A\beta|\sin(\pi f\beta)|/(\pi f\beta)$, which is zero at frequencies that are even integer multiples of $1/(2\beta)$ and has an upper bound of $A/(\pi f)$ at frequencies that are odd multiples of $1/(2\beta)$. The spectral envelope is a Sinx/x function that is defined by the fourier transform of a pulse. In known comb generators, the pulse width is typically made narrow, i.e., $1/(\beta F_i)$ is greater than N, where N is the desired output harmonic and $F_i$ is the frequency of the input signal, so that there are many harmonics between $F_i$ and $1/\beta$. Wider pulse widths can also be chosen that still maximize the power in the desired Nth harmonic such that the pulse width is an odd multiple of $1/(2NF_i)$. This is useful when extremely narrow pulse widths are impractical, or when it is desirable to locate the nulls in the spectral envelope at the N−1 and N+1 harmonics to simplify the filtering requirements. An example would be setting $\beta=1/(2F_i)$ which places the nulls of the spectral envelope at all the even harmonics of the input frequency.

FIG. 1 is a graph with frequency on the horizontal axis and amplitude on the vertical axis. A series of impulses 10 are shown that identify the harmonic frequencies in the output signal. A spectral envelope 12 identifies the Sin x/x function of the Fourier transform of the pulses. By varying the pulse width of the pulses, the lobes of the envelope 12 change. For example, when the pulse widths get narrower, the lobes of the spectral envelope 12 get wider, and vice versa. This changes the null locations between the lobes, relative to frequency. A curve, referred to herein as a meta-envelope 14, is a decaying exponential-type function that contacts each lobe at one location, as shown. The meta-envelope 14 represents the maximum output power that can be achieved for a particular amplitude input signal. The meta-envelope 14 is the same for a particular input frequency. As the pulse width changes, the location where the meta-envelope 14 contacts the lobe changes relative to the null locations. It is desirable to have the meta-envelope 14 contact the lobes half-way between the null locations for maximum power.

What is needed is a comb frequency generator that is tunable to vary the pulse width of the output signal to maximize the power for a selected harmonic. It is therefore an object of the present invention to provide such a tunable comb generator.

SUMMARY OF THE INVENTION

In accordance with the teachings of the present invention, a comb frequency generator is disclosed that is tunable to achieve a maximum output power for different harmonic frequencies of an input signal. A wavefront compression device provides wavefront compression of the signal to create an output signal having periodic fast edges. The wavefront compression device can be an NLTL employing varactor-type step recovery diodes. In one embodiment, the fast edge signal from the wavefront compression device is applied to a shorted transmission line stub that includes a series of switching devices, such as micro-electro-mechanical (MEM) devices positioned along the stub. The switching devices are selectively activated to control the length of the stub and the reflection point of the fast edge signal therefrom. Selecting the length of the transmission line stub by activating a certain switching device controls the delay of the fast edge signal travelling thereon. When the original fast edge signal and the delayed fast edge signal combine at the transmission line stub connection point, a pulsed signal is generated where the width of the pulses in the signal is controlled by the length of the stub.

In an alternate embodiment that can provide longer delays and high resolution, the fast edge signal from the wavefront compression device is sent to a power divider that separates the signal into two paths. One of the fast edge signals is applied to a variable time delay device, such as another NLTL employing varactor-like step recovery diodes, that controls the delay of the fast edge signal relative to the other fast edge signal so that the edges in the signals do not align. The two fast edge signals are applied to a combiner that combines the signals so that the difference between the fast edges in the two signals generates a pulsed signal. The width of the pulses is controllable by the delay from the time delay device.

Additional advantages and features of the present invention will become apparent from the following description and appended claims, taken in conjunction with the accompanying drawings.

DETAILED DESCRIPTION OF THE EMBODIMENTS

The following discussion of the embodiments of the invention directed to a tunable comb frequency generator is merely exemplary in nature, and is in no way intended to limit the invention or its applications or uses.

Figure 1:
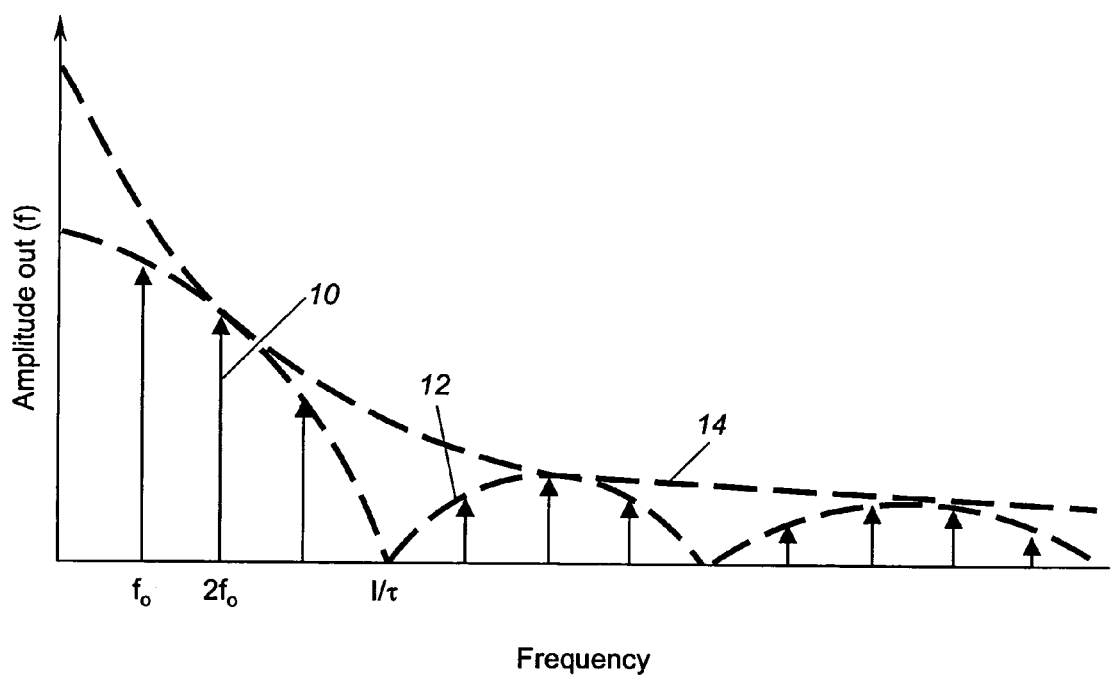
FIG. 1 is a graph with frequency on the horizontal axis and amplitude on the vertical axis showing a spectral envelope and a meta-envelope of an output signal from a comb frequency generator.
Figure 2:
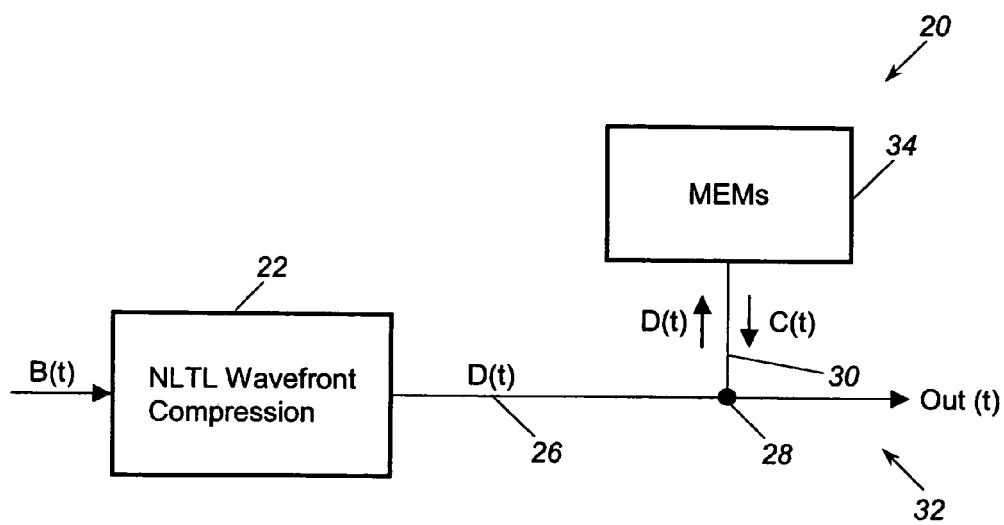
FIG. 2 is a schematic diagram of a tunable comb frequency generator employing a transmission line stub and MEM devices, according to an embodiment of the present invention.
Figure 4:
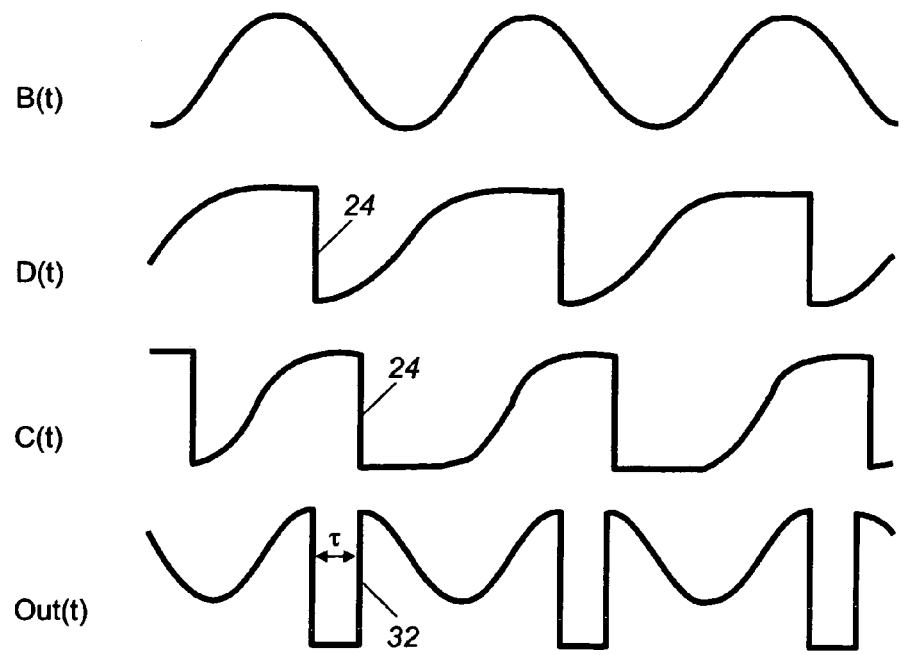
FIG. 4 is a series of signals at different locations in the tunable comb generator of the invention.

FIG. 2 is a schematic block diagram of a tunable comb frequency generator 20, according to one embodiment of the present invention. A sinusoidal, or near sinusoidal, input signal B(t), shown in FIG. 4, is applied to an NLTL device 22 that provides wavefront compression. In this embodiment, the NLTL device 12 is a transmission line that incorporates periodic Schottky varactor diodes to provide the wavefront compression and the fast edge signals. However, any suitable wavefront compression device can be used consistent with the discussion herein. In this embodiment, the input signal B(t) is a relatively large signal that self-biases the diodes in the NLTL device 22, causing a reduction in propagation time when the reverse bias of the diodes is greater. This causes a reduction in the fall time of the propagating wave. The NLTL device 22 is designed so that the Bragg frequencies and the diode cut-off frequencies are high enough to cause an acceptably small distortion to the wavefront of the input signal. The number of NLTL diode sections in the device 12 is chosen to fully develop the compressed wavefront. The NLTL 22 generates a series of fast-edge falling transitions from the slow falling transition of the signal B(t), creating a harmonically rich signal D(t). The signal D(t) from the NLTL device 22 is shown in FIG. 4 and has fast falling edges 24.

The signal D(t) propagates along output line 26 towards a node 28. A shorted transmission line stub 30 is connected to the node 28. The signal D(t) splits at the node 28, where a split portion of the signal D(t) propagates up the stub 30 and an output portion of the signal D(t) continues along the line 26. When the split portion of the signal D(t) reaches the shorted end of the stub 30, it is reflected back towards the node 28 as a delayed signal C(t). The delayed signal C(t) is shown in FIG. 4. As is apparent, the falling edges 24 in the signal C(t) are delayed relative to the falling edges 24 in the signal D(t). The signal C(t) is delayed a period of time determined by the length of the stub 30 and its propagation thereon. The delayed signal C(t) recombines with the output portion of the signal D(t) at the node 28, and has approximately the same amplitude as the signal D(t) at the node 28. The combination of the output portion of the signal D(t) and the delayed signal C(t) generates an output signal Out(t), also shown in FIG. 4. Pulses 32 in the output signal Out(t) are created by the temporal difference between the fast edges 24 in the delayed signal C(t) and the output signal D(t).

The generator 20 is tunable by defining the width τ of the pulses 32 in the output signal Out(t) by controlling the delay of the signal C(t). To provide this control of the delay, a series of MEM devices 34 are selectively positioned along the stub 30 at predetermined intervals. In general, each MEM device 34 is a switch that can be selectively switched open or closed. MEM devices are typically a suspended thin piece of metal that is flexed by an electric field to make or break an electrical contact. By opening a MEM device 34, an open circuit is created, providing the reflection point for the split signal D(t). In alternate designs, at certain frequencies, a reflection point can be made by closing a certain device 34 consistent with transmission line theory. In one embodiment, there are five MEM devices 34 positioned along a stub 30 that is 1/B(t) long to provide about a 2 to 1 tuning range.

A discussion of a MEM device suitable for this purpose can be found in U.S. Pat. No. 5,880,921. However, the use of the MEM devices 34 is by way of a non-limiting example in that any suitable device can be used to control the length of the stub 30. By closing the MEM device 34 closest to the node 28, and opening an MEM device 34 farther from the node 28, the delay is increased, and vice-versa. Therefore, by selectively controlling the MEM devices 34, the width of the pulse 32 can be increased or decreased to provide the desirable tuning to maximize the power for the particular harmonic. Only a discrete set of delays can be selected, so the delay step size is designed to be small enough so that the degraded output power of the desired harmonic is acceptable.

Figure 3:
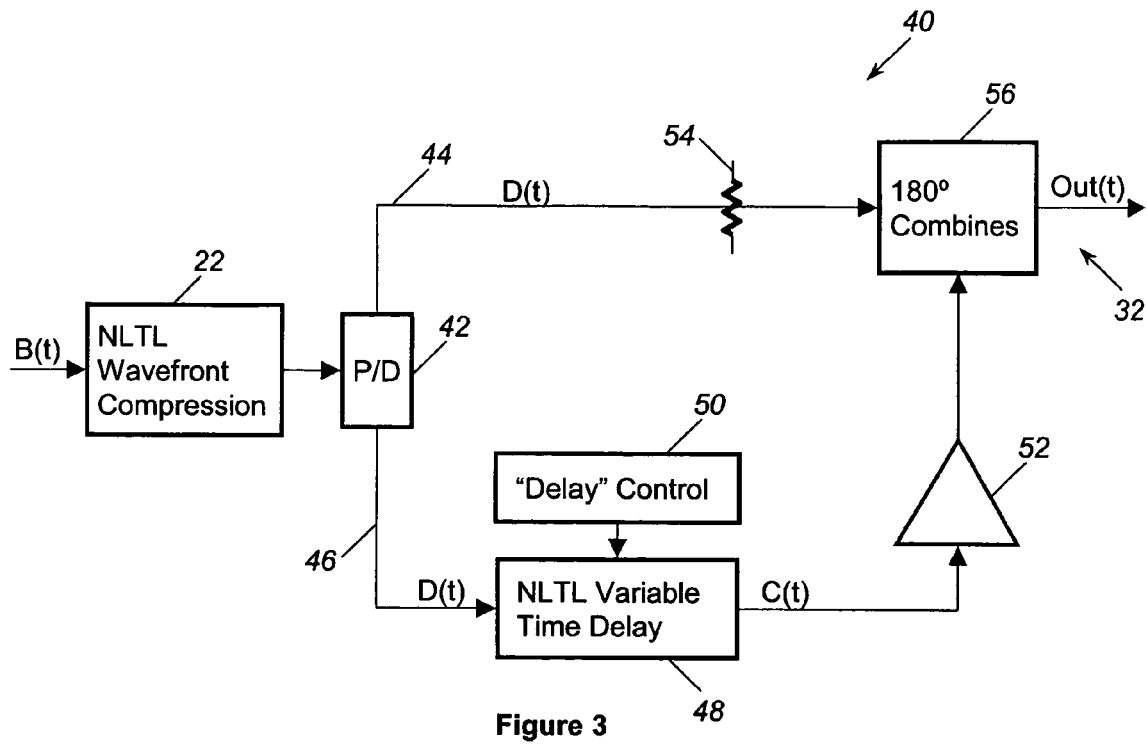
FIG. 3 is a schematic diagram of another tunable comb frequency generator, employing a variable time delay NLTL, according to another embodiment of the present invention.

Because the stub 30 uses fast propagation and includes the MEM devices 34 for every delay step, there is a practical limitation to the range and the time of delays that can be generated by generator 20. If longer delays or a greater range of delays is desired than is practical with the delays provided by the stub 30 and the MEM devices 34, a comb generator 40, shown in FIG. 3, according to another embodiment of the present invention, can be provided. The comb generator

40 also includes the wavefront compression device 22 that receives the sinusoidal input signal B(t) and provides wavefront compression to generate the signal D(t) having the fast edges 24. The signal D(t) is applied to a power divider 42 that splits the signal into lines 44 and 46, where the majority of the power is sent along the line 44. In one embodiment, +20 dB$_M$ is sent on the line 44 and −20 dB$_M$ is sent on the line 46. The signal D(t) on the line 46 is applied to a variable time delay NLTL device 48. In one embodiment, a series of inductors and varactor diodes are used in the NLTL device 48 to model a transmission line, and provide a delay between an input and an output of the device 48. By changing the voltages across the varactor diodes, the capacitance changes which changes the amount of the delay of the device 48. A delay control signal from a voltage device 50 controls the voltage applied to the varactor diodes and how much the low amplitude signal D(t) is delayed to generate the signal C(t) at its output. The time delay is implemented with the NLTL device 48 used in small-signal mode. Wavefront compression is avoided by using low amplitude signals so that the DC bias is not appreciably affected. This is why only a small portion of the signal D(t) is applied to line 46. Instead, the propagation velocity along the NLTL device 48 is controlled by manipulating the DC bias of the varactor diodes.

When the MEM devices 34 are used to create the variable delay, no special signal combining is required. However, when the NLTL device 48 is used to provide the variable delay, the delayed signal C(t) is much smaller in amplitude than the signal D(t) on the line 44. To make the signals closer in amplitude, an amplifier 52 can be used to amplify the signal C(t) on the line 46, or an attenuator 54 positioned in the line 44 can be used to reduce the signal D(t), or a combination thereof. The amplified signal C(t) or the attenuated signal D(t) are both applied to a 180° combiner 56 that combines (adds or subtracts) the signals to generate the Out(t) signal discussed above.

By varying the delay in the NLTL device 48, the width of the pulses 32 can be adjusted to tune the generator 40 and maximize the power output for a particular harmonic. Changing the width of the pulses 42 adjusts the Sinx/x function of the output of the NLTL device 22 so that it aligns with the meta-envelope 14 to provide the desired power.

The foregoing discussion discloses and describes merely exemplary embodiments of the present invention. One skilled in the art will readily recognize form the previous discussion, and from the accompanying drawings and claims, that various changes, modifications and variations can be made therein without departing from the spirit and scope of the invention as defined in the following claims.

What is claimed is:

1. A comb generator for providing harmonics of an input signal, said generator comprising:
    a wavefront compression device responsive to the input signal, said wavefront compression device generating a compressed fast-edge signal including a series of fast edges;
    a variable time delay device responsive to the fast-edge compressed signal, said delay device delaying the fast-edge compressed signal to create a delayed fast-edge signal; and
    a combining device responsive to the fast-edge compressed signal and the delayed signal to generate an output signal including a series of pulses having a pulse width determined by the delay between the delayed signal and the compressed signal.

2. The generator according to claim 1 wherein the delay device is a combination of a transmission line stub and a switching device that controls the length of the stub, said fast-edge compressed signal propagating along the stub and being reflected therefrom to create the delayed signal.

3. The generator according to claim 2 wherein the switching device is a series of micro-electro-mechanical devices positioned along the transmission line stub.

4. The generator according to claim 1 wherein the delay device is an NLTL variable time delay device.

5. The generator according to claim 4 further comprising a power divider, said power divider being responsive to the fast-edge compressed signal and separating the fast-edge compressed signal into a first fast-edge compressed signal and a second fast-edge compressed signal, said variable time delay device being responsive to the first fast-edge compressed signal.

6. The generator according to claim 5 wherein the combining device is a 180° combiner that is responsive to the second fast-edge compressed signal and the delayed signal to generate the output signal.

7. The generator according to claim 5 wherein the second fast-edge compressed signal is of significantly higher power than the first fast-edge compressed signal, said generator further comprising an amplifier responsive to the delayed signal from the NLTL delay device so as to amplify the delayed signal to be approximately equal to the amplitude of the second fast-edge compressed signal.

8. The generator according to claim 1 wherein the wavefront compression device is an NLTL wavefront compression device.

9. A comb generator for providing harmonics of a sinusoidal input signal, said generator comprising:
    a non-linear transmission line wavefront compression device responsive to the input signal, said wavefront compression device generating a compressed signal including a series of fast-edges;
    a transmission line stub responsive to the compressed fast-edge signal and generating a delayed fast-edge signal from the compressed fast-edge signal propagating along the transmission line stub and being reflected therefrom; and
    a series of micro-electro-mechanical devices positioned along the transmission line stub, said micro-electro-mechanical devices selectively controlling the length of the transmission line stub to control the delay of the delayed fast-edge signal.

10. The generator according to claim 9 further comprising a combining node defining a connection point for the transmission line stub, said combining node receiving and combining the compressed fast-edge signal and the delayed signal to generate an output signal having pulses whose width is controlled by the fast-edges in the compressed signal and the delayed signal.

11. A comb generator for providing harmonics of an input signal, said generator comprising:
    an NLTL wavefront compression device responsive to the input signal, said wavefront compression device generating a compressed fast-edge signal including a series of fast edges;
    a power divider responsive to the fast-edge compressed signal and separating the fast-edge compressed signal into a first fast-edge compressed signal and a second fast-edge compressed signal;
    an NLTL variable time delay device responsive to the first fast-edge compressed signal, said delay device delaying the first fast-edge compressed signal to create a delayed fast-edge signal; and a combining device responsive to the second fast-edge compressed signal and the delayed signal to generate an output signal including a series of pulses having a pulse width determined by the difference between the fast-edges in the second fast-edge compressed signal and the delayed signal.

12. The generator according to claim 11 wherein the combining device is a 180° combiner that is responsive to the second fast-edge compressed signal and the delayed signal to generate the output signal.

13. The generator according to claim 11 wherein the second fast-edge compressed signal is of significantly higher power than the first fast-edge compressed signal, said generator further comprising an amplifier responsive to the delay signal from the NLTL delay device so as to amplify the delay signal to be approximately equal to the amplitude of the second fast-edge compressed signal.

14. The generator according to claim 11 wherein the second fast-edge compressed signal is of significantly high power than the first fast-edge compressed signal, said generator further comprising an attenuation device responsive to the second fast-edge signal so as to attenuate the second fast-edge signal to be approximately equal to the amplitude of the delayed signal.

15. A method for generating harmonics of a sinusoidal input signal, said method comprising:
   compressing the input signal to generate a compressed fast-edge signal including a series of fast edges;
   delaying the fast-edge compressed signal to generate a delayed fast-edge signal; and
   combining the fast-edge compressed signal with the delayed signal to generate an output signal including a series of pulses having a pulse width determined by the delay of the delayed signal.

16. The method according to claim 15 wherein compressing the input signal includes using an NLTL wavefront compression device.

17. The method according to claim 15 wherein delaying the compressed signal includes using a shorted transmission line stub and a series of micro-electro-mechanical devices positioned along the transmission line stub to control the length of the stub.

18. The method according to claim 15 wherein delaying the compressed signal includes using an NLTL variable time delay device.

19. The method according to claim 15 further comprising applying the fast-edge compressed signal to a power divider to separate the fast-edge compressed signal into a first fast-edge compressed signal and a second fast-edge compressed signal, wherein delaying the compressed signal includes delaying the first fast-edge compressed signal.

20. The method according to claim 19 wherein combining the fast-edge compressed signal with the delayed signal includes combining the delayed signal and the second fast-edge signal in a 180° combiner.

* * * * *